(12) United States Patent
Budnick et al.

(10) Patent No.: US 11,340,296 B2
(45) Date of Patent: May 24, 2022

(54) ELECTRONIC DEVICE WITH SOLID STATE SWITCH MONITORING

(71) Applicant: MOTOROLA MOBILITY LLC, Chicago, IL (US)

(72) Inventors: Dennis Budnick, Richmond, IL (US); Francis Kuzhiyil, Deerfield, IL (US)

(73) Assignee: Motorola Mobility LLC, Chicago, IL (US)

( * ) Notice: Subject to any disclaimer, the term of this patent is extended or adjusted under 35 U.S.C. 154(b) by 479 days.

(21) Appl. No.: 16/452,053

(22) Filed: Jun. 25, 2019

(65) Prior Publication Data

US 2020/0408839 A1 Dec. 31, 2020

(51) Int. Cl.
*G01R 31/327* (2006.01)
*H03K 17/56* (2006.01)

(52) U.S. Cl.
CPC ......... *G01R 31/3277* (2013.01); *H03K 17/56* (2013.01)

(58) Field of Classification Search
None
See application file for complete search history.

(56) References Cited

U.S. PATENT DOCUMENTS

| | | | |
|---|---|---|---|
| 6,204,643 B1 | 3/2001 | Kouwa et al. | |
| 6,839,052 B1 | 1/2005 | Kramer | |
| 9,768,689 B1 | 9/2017 | Pazhayaveetil et al. | |
| 2005/0052807 A1 | 3/2005 | Klippel et al. | |
| 2006/0238205 A1* | 10/2006 | Francis | H03K 17/962 324/658 |
| 2007/0236852 A1 | 10/2007 | Plivcic et al. | |
| 2008/0224900 A1* | 9/2008 | Konno | H03K 17/962 341/33 |
| 2009/0322410 A1* | 12/2009 | David | G06F 3/0412 327/517 |
| 2016/0118980 A1* | 4/2016 | Maharyta | H03K 17/22 327/517 |
| 2018/0111546 A1* | 4/2018 | Salter | B60Q 3/20 |

OTHER PUBLICATIONS

Patent Cooperation Treaty, International Application No. PCT/US20/39192, International Search Report, dated Sep. 14, 2020.
Patent Cooperation Treaty, International Application No. PCT/US20/39192, Written Opinion, dated Sep. 14, 2020.
Dietz, Paul H. et al., "Wireless Liquid level Sensing for Restaurant Applications", IEEE Sensors 2002.
Ignatov, Ivailo Marionov, "Sensor Interface", Microchip Technology Inc., 1997.

* cited by examiner

*Primary Examiner* — Patrick Assouad
*Assistant Examiner* — Haidong Zhang
(74) *Attorney, Agent, or Firm* — Isidore PLLC (57) ABSTRACT

A solid state switch (SSS) monitoring system of an electronic device includes a SSS sensing component that is electrically coupled to a solid state switch. The SSS sensing component periodically generates a clocked pulse that polls the solid state switch. The SSS sensing component determines whether an electrical characteristic of an output of the solid state switch indicates that the solid state switch is actuated. The SSS sensing component generates a switch state signal to indicate a corresponding one of an actuated and an unactuated state of the solid state switch. A controller is communicatively coupled to the SSS sensing component. The controller restarts the SSS sensing component in response to determining that the SSS sensing component is in an inoperative state.

18 Claims, 5 Drawing Sheets

ELECTRONIC DEVICE WITH SOLID STATE SWITCH MONITORING

1. Technical Field

The present disclosure relates generally to electronic devices having user input controls and in particular to electronic devices that use solid state user input keys.

2. Description of the Related Art

Electronic devices generally have user control keys or buttons to provide basic activation and mode settings, such as power, volume, etc. Mechanical actuation of a key causes a circuit to open or close, signaling a change of state. Analog or digital components respond to the change of state due to the mechanical actuation. Although simple to implement, the mechanical actuation is associated with reliability limitations. A frequently-used key will eventually fail with repeated use. Solid state keys rely on a change in electrical characteristic such as resistance, capacitance or inductance based on user actuation. Sensing integrated circuits (ICs) detect changes in the electrical characteristic of the solid state switch to generate a corresponding input state. By eliminating moving parts, solid state keys can have increased reliability over mechanically actuated keys.

Power keys are an example of a user control key that receives frequent use and whose reliability is essential for the operational use of an electronic device. Often such keys are required to be used when a controlled component may be in an unpowered, inactivated state. Errors that may occur in the sensing IC can leave the electronic device inoperable without a way to power up a processor or other essential component.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

According to aspects of the present innovation, a solid state switch (SSS) monitoring system of an electronic device and a method are provided to enable reliable use of solid state switches. Solid state switches often inherently do not mechanically wear out as quickly as mechanical switches and are not affected by external factors like Hall Effect sensors. However, active sensing has to also be reliable.

According to one aspect, an SSS sensing component is coupled to a solid state switch. The SSS sensing component polls a solid state switch such as a power key when other functional components of the electronic device are powered down or in low power inactive state. The SSS sensing component periodically generates a clocked pulse that polls the solid state switch. The SSS sensing component determines whether an electrical characteristic of an output of the solid state switch indicates that the solid state switch is actuated. The SSS sensing component generates a switch state signal to indicate a corresponding one of an actuated and an unactuated state of the solid state switch. To mitigate instances in which the SSS sensing component becomes inoperative due to a fault that prevents polling the solid state switch, a supervisory controller ("controller") is communicatively coupled to the SSS sensing component. The controller restarts the SSS sensing component in response to determining that the SSS sensing component is in an inoperative state.

In the following detailed description of exemplary embodiments of the disclosure, specific exemplary embodiments in which the various aspects of the disclosure may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present disclosure. The following detailed description is, therefore, not to be taken in a limiting sense, and the scope of the present disclosure is defined by the appended claims and equivalents thereof. Within the descriptions of the different views of the figures, similar elements are provided similar names and reference numerals as those of the previous figure(s). The specific numerals assigned to the elements are provided solely to aid in the description and are not meant to imply any limitations (structural or functional or otherwise) on the described embodiment. It will be appreciated that for simplicity and clarity of illustration, elements illustrated in the figures have not necessarily been drawn to scale. For example, the dimensions of some of the elements are exaggerated relative to other elements.

It is understood that the use of specific component, device and/or parameter names, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that term is utilized.

As further described below, implementation of the functional features of the disclosure described herein is provided within processing devices and/or structures and can involve use of a combination of hardware, firmware, as well as several software-level constructs (e.g., program code and/or program instructions and/or pseudo-code) that execute to provide a specific utility for the device or a specific functional logic. The presented figures illustrate both hardware components and software and/or logic components.

Those of ordinary skill in the art will appreciate that the hardware components and basic configurations depicted in the figures may vary. The illustrative components are not intended to be exhaustive, but rather are representative to highlight essential components that are utilized to implement aspects of the described embodiments. For example, other devices/components may be used in addition to or in place of the hardware and/or firmware depicted. The depicted example is not meant to imply architectural or other limitations with respect to the presently described embodiments and/or the general invention.

The description of the illustrative embodiments can be read in conjunction with the accompanying figures. Embodiments incorporating teachings of the present disclosure are shown and described with respect to the figures presented herein.

Figure 1:
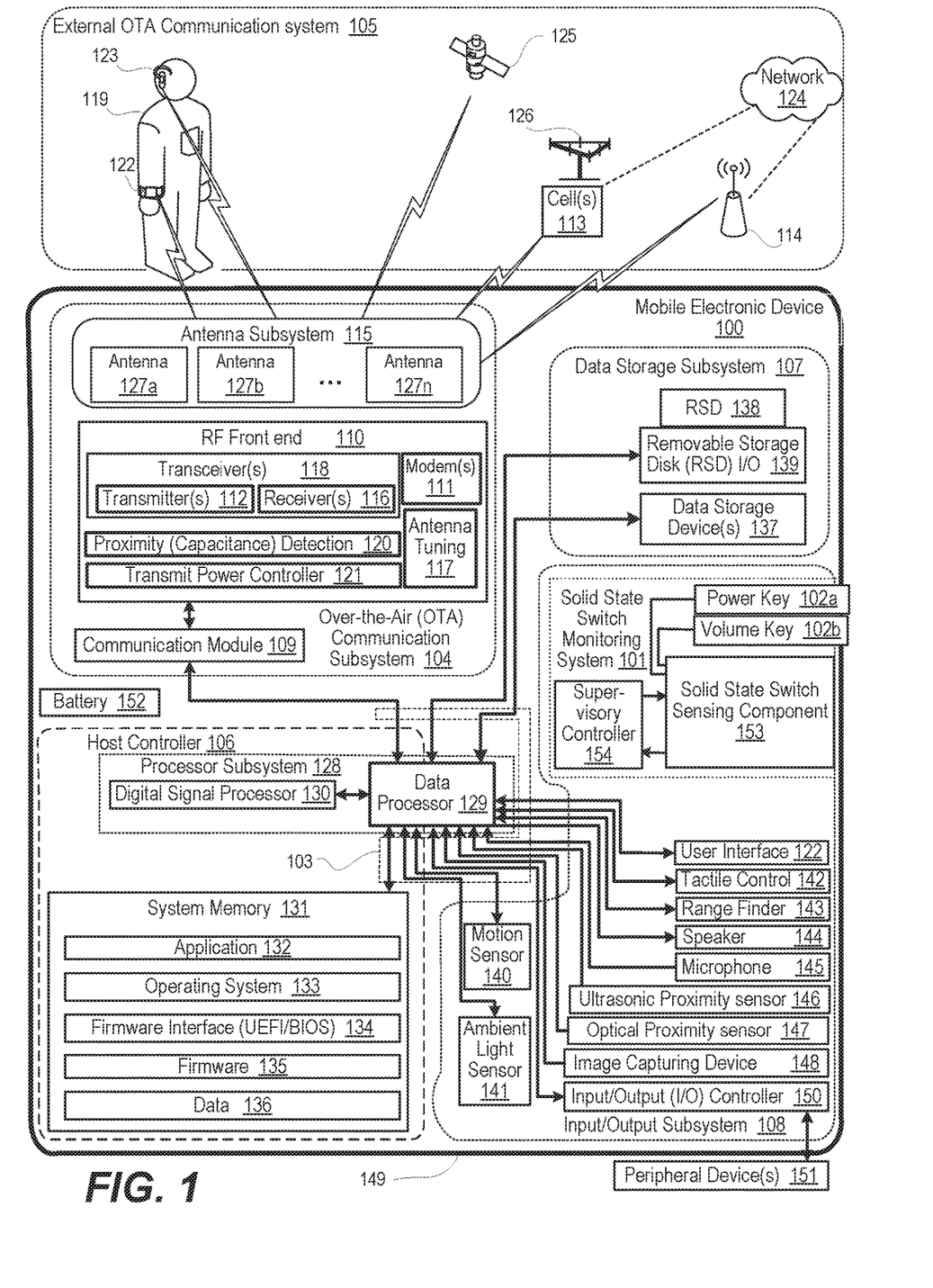
FIG. 1 is a functional block diagram illustrating a mobile electronic device having a solid state switch (SSS) monitoring system, according to one or more embodiments.

FIG. 1 is a functional block diagram illustrating example mobile electronic device 100 having a solid state switch monitoring system 101 of one or more solid state switches. In one or more embodiments, the solid state switch is a selected one of: (i) a capacitive switch; (ii) a resistive switch; (iii) an inductive switch; and (iv) a piezoresistive switch. In a particular embodiment, the solid state switch is a power switch, depicted as power key 102a and volume key 102b, which can be actively monitored when other functional components of mobile electronic device 100 are inactive.

Mobile electronic device 100 can be one of a host of different types of devices, including but not limited to, a mobile cellular phone, satellite phone, or smart-phone, a laptop, a net-book, an ultra-book, a networked smart watch or networked sports/exercise watch, and/or a tablet computing device or similar device that can include wireless communication functionality. As a device supporting wireless communication, mobile electronic device 100 can be utilized as, and also be referred to as, a system, device, subscriber unit, subscriber station, mobile station (MS), mobile, mobile device, remote station, remote terminal, user terminal, terminal, user agent, user device, a Session Initiation Protocol (SIP) phone, a wireless local loop (WLL) station, a personal digital assistant (PDA), computer workstation, a handheld device having wireless connection capability, a computing device, or other processing devices connected to a wireless modem. These various devices all provide and/or include the necessary hardware and software to support the various wireless or wired communication functions as part of a communication system. Mobile electronic device 100 can also be an over-the-air link in a communication system. Mobile electronic device 100 can be intended to be portable, hand-held, wearable, detachable, positioned in a fixed location, or mounted to a movable vehicle. Examples of such over-the-air link communication devices include a wireless modem, an access point, a repeater, a wirelessly-enabled kiosk or appliance, a femtocell, a small coverage area node, and a wireless sensor, etc. Mobile electronic device 100 can have computing functionality directed to local functionality without wide area communication capabilities.

Referring now to the specific component makeup and the associated functionality of the presented components, mobile electronic device 100 includes over-the-air (OTA) communication subsystem 104 that communicates with external OTA communication system 105. Mobile electronic device 100 provides computing and data storage functionality in support of OTA communication with external OTA communication system 105. Mobile electronic device 100 also provides other functions with host controller 106, data storage subsystem 107, and input/output (I/O) subsystem 108 that are communicatively coupled to each other via a system interlink 103.

OTA communication subsystem 104 includes communication module 109 that operates in baseband to encode data for transmission and decodes received data, according to a predetermined communication protocol. OTA communication subsystem 104 includes radio frequency (RF) front end 110 having one or more modem(s) 111. Modem(s) 111 modulate baseband encoded data from communication module 109 onto a carrier signal to provide a transmit signal that is amplified by transmitter(s) 112. Modem(s) 111 demodulates the received signal from cell 113 or node 114 detected by antenna subsystem 115. The received signal is amplified and filtered by receiver(s) 116, which demodulate received encoded data from a received carrier signal. Antenna tuning circuitry 117 adjusts antenna impedance of antenna subsystem 115. Antenna tuning circuitry 117 improves antenna efficiency at desired transmit or receive frequencies of transmitter(s) 112 and receiver(s) 116, respectively, within transceiver(s) 118. In one or more embodiments, electronic device 100 is proximate to, or on, a body generating a lossy dielectric effect for mobile electronic device 100. Antenna tuning circuitry 117 is electrically coupled to antenna subsystem 115 to compensate for a lossy dielectric effect of being proximate to a person 119. RF front end 110 can include proximity detection component 120 that monitor for a capacitive effect on antenna subsystem 115 for limiting transmit power set by transmit power controller 121.

Host controller 106 controls the OTA communication subsystem 104, user interface device 122, and other functions and/or operations of mobile electronic device 100. These functions and/or operations include, but are not limited to including, application data processing and signal processing. Mobile electronic device 100 may use hardware component equivalents for application data processing and signal processing. For example, mobile electronic device 100 may use special purpose hardware, dedicated processors, general purpose computers, microprocessor-based computers, micro-controllers, optical computers, analog computers, dedicated processors and/or dedicated hard wired logic. As utilized herein, the term "communicatively coupled" means that information signals are transmissible through various interconnections, including wired and/or wireless links, between the components. The interconnections between the components can be direct interconnections that include conductive transmission media or may be indirect interconnections that include one or more intermediate electrical components. Although certain direct interconnections (interlink 103) are illustrated in FIG. 1, it is to be understood that more, fewer, or different interconnections may be present in other embodiments.

In one or more embodiments, host controller 106, via OTA communication subsystem 104, performs multiple types of OTA communication with external OTA communication system 105. OTA communication subsystem 104 can communicate with one or more personal access network (PAN) devices within external OTA communication system 105, such as smart watch 122 and wireless headset 123 that is reached via Bluetooth connection. In one or more embodiments, OTA communication subsystem 104 communicates with one or more locally networked devices via a wireless local area network (WLAN) link provided by node 114. Node 114 is in turn connected to wide area network 124, such as the Internet. In one or more embodiments, OTA communication subsystem 104 communicates with global positioning system (GPS) satellites 125 to obtain geospatial location information. In one or more embodiments, OTA communication subsystem 104 communicates with radio access network (RAN) 126 having respective base stations (BSs) or cells 113. RANs 126 are a part of a wireless wide area network (WWAN) that is connected to wide area network 124 and provides data and voice services. In one or more embodiments, antenna subsystem 115 includes multiple antenna elements 127a-n that are individually tuned to selected RF bands to support different RF communication bands and protocols. Antenna elements 127a-n can be used in combination for multiple input multiple output (MIMO) operation for beam steering and spatial diversity.

The techniques described herein may be used for various wireless communication networks that operate according to, but not limited to, any one or more of the OMA (Open Mobile Alliance), 3GPP (3rd Generation Partnership Project), 3GPP2 (3rd Generation Partnership Project 2), IEEE (Institute of Electrical and Electronics Engineers) 802.xx, and WiMAX Forum standards. The terms "networks" and "systems" are often used interchangeably. Such communication networks can be Code Division Multiple Access (CDMA) networks, Time Division Multiple Access (TDMA) networks, Frequency Division Multiple Access (FDMA) networks, Orthogonal FDMA (OFDMA) networks, Single-Carrier FDMA (SC-FDMA) networks, etc. A CDMA network may implement a radio technology such as Universal Terrestrial Radio Access (UTRA), CDMA 2000, etc. UTRA includes Wideband-CDMA (W-CDMA) and time division synchronous code division multiple access (TD-SCDMA). CDMA2000 covers IS-2000, IS-95 and IS-856 standards. A TDMA network may implement a radio technology such as Global System for Mobile Communications (GSM). An OFDMA network may implement a radio technology such as Evolved UTRA (E-UTRA), IEEE 802.11, IEEE 802.16, IEEE 802.20, Flash-OFDM, etc. UTRA, E-UTRA, and GSM are part of Universal Mobile Telecommunication System (UMTS). Long Term Evolution (LTE) is a recent release of UMTS that uses E-UTRA. UTRA, E-UTRA, GSM, UMTS and LTE are described in documents from the 3GPP organization. CDMA2000 is described in documents from the 3GPP2 organization. These various radio technologies and standards are known in the art. Aspects of the present innovation can further be implemented with 5G (short for 5th Generation), which is a commonly used term for certain advanced wireless systems. Industry association 3GPP defines any system using "5G NR" (5G New Radio) software as "5G", a definition that came into general use by late 2018. Others may reserve the term for systems that meet the requirements of the ITU IMT-2020, which represents more nations. 3GPP will submit their 5G NR to the ITU. 5G follows 2G, 3G and 4G and their respective associated technologies (such as GSM, UMTS, LTE, LTE Advanced Pro, etc.).

Host controller 106 includes processor subsystem 128, which executes program code to provide functionality of mobile electronic device 100. Processor subsystem 128 includes one or more central processing units (CPUs) ("data processor") 129. In one or more embodiments, processing subsystem 128 includes a digital signal processor (DSP) 130. Host controller 106 includes system memory 131, which contains actively used program code and data. In one or more embodiments, system memory 131 includes therein a plurality of such program code and modules, including applications 132. System memory 131 can also include operating system (OS) 133, firmware interface 134 such as basic input/output system (BIOS) or Uniform Extensible Firmware Interface (UEFI), and platform firmware 135. These software and/or firmware modules have varying functionality when their corresponding program code is executed by processor subsystem 128 or secondary processing devices within mobile electronic device 100.

Data storage subsystem 107 provides nonvolatile storage accessible to host controller 106. For example, data storage subsystem 107 can provide a large selection of other applications 132 that can be loaded into system memory 131. In one or more embodiments, local data storage device(s) 137 includes hard disk drives (HDDs), optical disk drives, solid state drives (SSDs), etc. In one or more embodiments, removable storage device (RSD) 138 that is received in RSD interface 139 is a computer program product or computer readable storage device, which can be referred to as non-transitory. RSD 138 can be accessed by host controller 106 to provision mobile electronic device 100 with program code. When executed by host controller 106, the program code provides functionality to mobile electronic device 100 to perform content processing, communication and other tasks.

I/O subsystem 108 includes input and output devices. For example, motion sensor 140 detects accelerations of mobile electronic device 100, which can indicate context of use as well as intentional gestures. Ambient light sensor 141 detects external light for adjusting brightness settings and for also indicating contextual information. User interface device 122 presents visual or tactile outputs as well as receives user inputs. Tactile/haptic control 142 provides an interface, such as for braille reading or manual inputs. Range finder 143 emits a waveform of energy, such as acoustic, infrared, radio frequency (RF), etc., whose time of flight is used to measure distance to a reflecting object. Audio speaker 144 provides audio output, including audio playback and alerts. Microphone 145 receives audible inputs. Ultrasonic proximity sensor 146 detects proximity of an ear of a user to audio speaker 144, including in one or more embodiments recognizing audio feedback from the ear canal. Optical proximity sensor 147 detects proximity of the hand or face of the user to mobile electronic device 100. Image capturing device 148, such as a camera, can receive gestures and other image data. I/O subsystem 108 can be wholly or substantially encompassed by device housing 149. In one or more embodiments, I/O controller 150 connects to one or more peripheral devices 151 that can include additional I/O functionality. I/O controller 150 can also interface to a wired local access network (LAN) (not shown).

In one or more embodiments, electrical power from battery 152 powers solid state switch (SSS) monitoring system 101 when other subsystems such as host controller 106 and OTA communication subsystem 104 may be inactive to conserve power. SSS sensing component 153 monitors power and volume keys 102a, 102b for actuation. Supervisory controller 154 monitors SSS sensing component 153 and can detect when SSS sensing component 153 becomes inoperative. Supervisory controller 154 restarts SSS sensing component 153 to return SSS sensing component 153 to operation.

Figure 2:
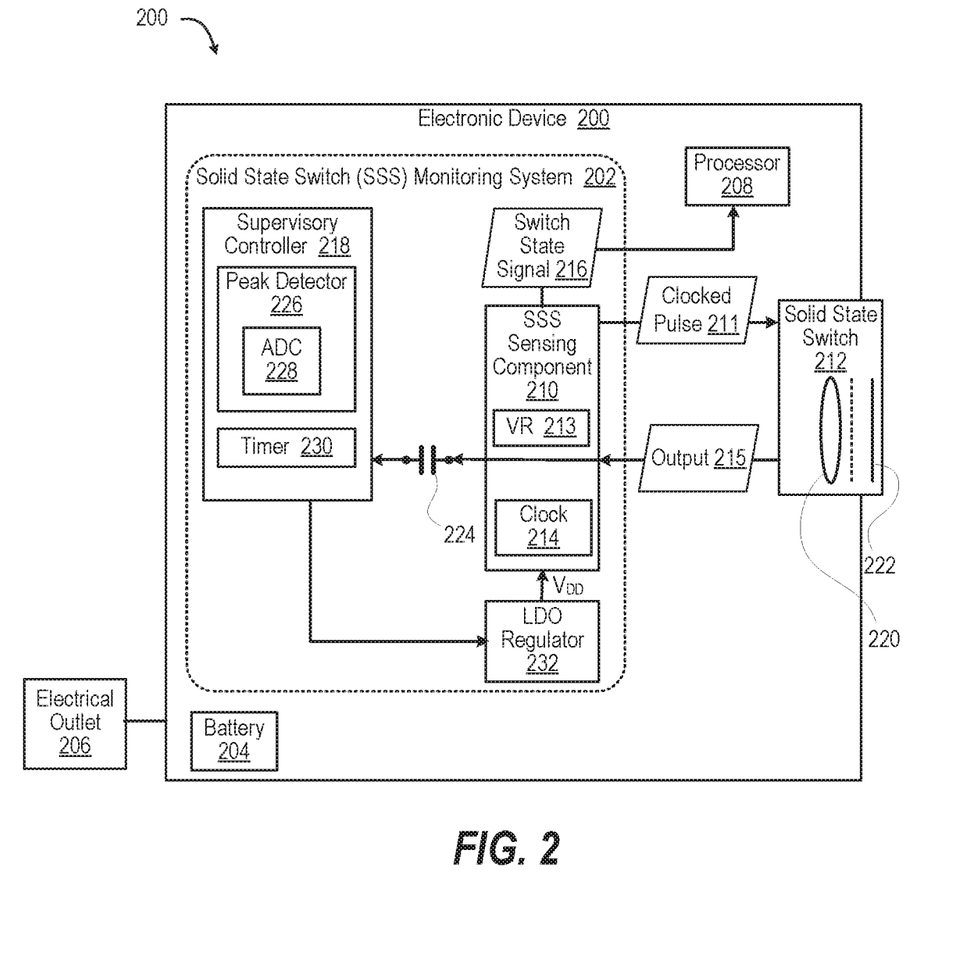
FIG. 2 depicts a functional block diagram of an example electronic device having an SSS monitoring system that ensures reliable activation from low power operation, according to one or more embodiments.

FIG. 2 depicts example electronic device 200 having solid state switch (SSS) monitoring system 202 that ensures reliable activation from low power operation. Electronic device 200 may be a laptop computer, tablet computer, personal computer, computer work station, embedded automobile computing systems, or mobile communication devices such as mobile electronic device 100 (FIG. 1). One or both of battery 204 and electrical outlet 206 provide electrical power to SSS monitoring system 202 and functional components such as processor 208 of electronic device 200. SSS monitoring system 202 includes SSS sensing component 210 that is electrically coupled to the solid state switch 212. SSS sensing component 210 periodically generates clocked pulse 211 that polls solid state switch 212. SSS sensing component 210 determines whether an electrical characteristic of output 214 of solid state switch 212 indicates that solid state switch 212 is actuated. SSS sensing component 210 generates switch state signal 216 to indicate a corresponding one of: (i) an actuated; and (ii) an unactuated state of solid state switch 212. For example, a functional component such as processor 208 can respond to a state of switch state signal 216. For example, an inactive processor 208 activates in response to receiving switch state signal 216 indicating the actuated state. Supervisory controller ("controller") 218 monitors SSS sensing component 210 for becoming inoperative. Controller 218 restarts SSS sensing component 210 when SSS sensing component 210 is detected as inoperative.

In one or more embodiments, SSS sensing component 210 detects a state of solid state switch 212, which can be inductive, resistive, or inductive. In one or more embodiments, solid state switch 212 uses only 2 In one or more embodiments, SSS sensing component 210 triggers voltage regulator 213 to send a high frequency pulse at programmable duty cycles to poll inductive solid state switch 212 based on duty-cycle clock 214. For example, a 1 ms pulse containing high signal frequencies can be followed by an off cycle of 12 ms to 1700 ms. The duration of the on-cycle can be based on having sufficient time for SSS monitoring system 202 to measure output 215 of solid state switch 212. The duration of the off-cycle can be made depending on a design selection that is a tradeoff between power consumption and detection latency by SSS monitoring system 202. The pulse passes through inductor coil 220, which changes electrical properties when ferrous material target 222, such as a printed circuit on a flexible substrate, is manipulated in close proximity to inductor coil 220. A change in the frequency of the pulse contained in output 215 is detected by SSS sensing component 210 as a key event.

In one or more embodiments, SSS sensing component 210 is DC isolated from controller 218 by series coupling capacitor 224. Controller 218 has peak detector 226 including analog-to-digital converter (ADC) 228 that latches to the peak voltage of output 215 of solid state sensor 212 to detect clocked pulse 211 from SSS sensing system 210. If clocked pulse 211 is detected within the defined timeframe, a "TRUE" logic value is set and timer 230 is reset. If clocked pulse 211 is not detected within the defined timeframe based on timer 230, a "FALSE" logic value is set. In one or more embodiments, the defined timeframe is 5 s, although shorter or longer defined timeframes may be used. SSS sensing component 210. The reset of LDO regulator 232 causes SSS sensing component 210 to restart, clearing a latched or other error condition that led to an inoperative state.

Figure 3:
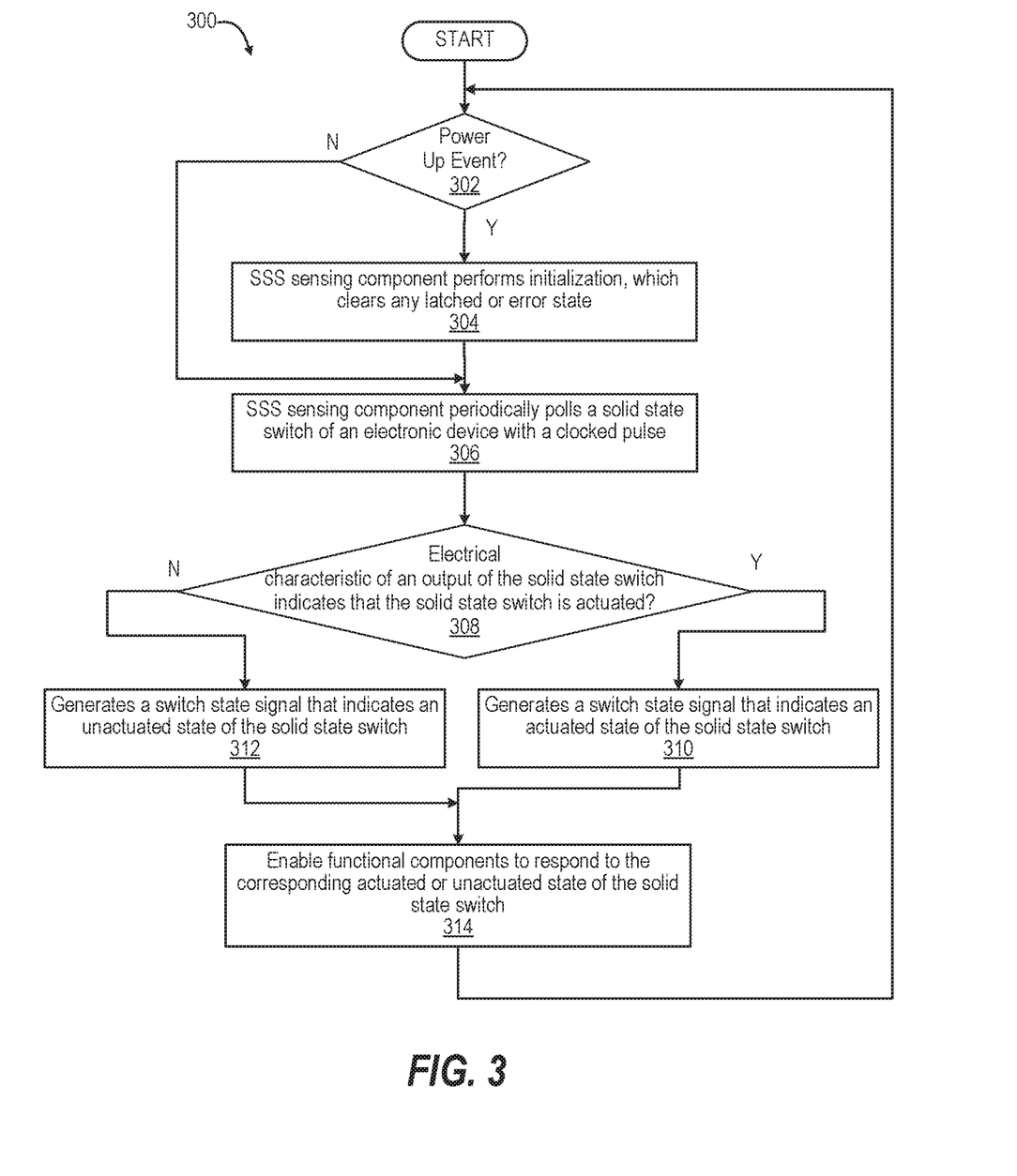
FIG. 3 depicts a flow diagram of a method for sensing an actuation state of a solid state switch by an electronic device, according to one or more embodiments.

FIG. 3 depicts method 300 for sensing an actuation state of a solid state switch 212 (FIG. 2) by electronic device 200 (FIG. 2). Method 300 includes, in decision block 302, determining, by solid state switch (SSS) sensing component 210 (FIG. 2), whether a power up event has occurred to the SSS sensing component. Although not depicted, SSS sensing component 210 (FIG. 2) is not capable of making this determine before actually being powered up. SSS sensing component is determining whether SSS sensing component is in an uninitialized state following power up. In response to determining that a power up event has occurred, SSS sensing component performs initialization, which clears any latched or error state (block 304). In response to determining that a power up event has not occurred in decision block 302 or after performing initialization in block 304, SSS sensing component periodically polls a solid state switch of an electronic device with a clocked pulse (block 306). Method 300 includes, in decision block 308, determining, by the SSS sensing component, whether an electrical characteristic of an output of the solid state switch indicates that the solid state switch is actuated. In response to determining that the solid state switch is actuated, method 300 includes generating a switch state signal that indicates an actuated state of the solid state switch (block 310). In response to determining that the solid state switch is not actuated, method 300 includes generating a switch state signal that indicates an unactuated state of the solid state switch (block 312). After generating the corresponding switch state signal in either block 310 or block 312, method 300 includes enabling functional components to respond to the corresponding actuated or unactuated state of the solid state switch (block 314). Then method 300 returns to block 302.

Figure 4:
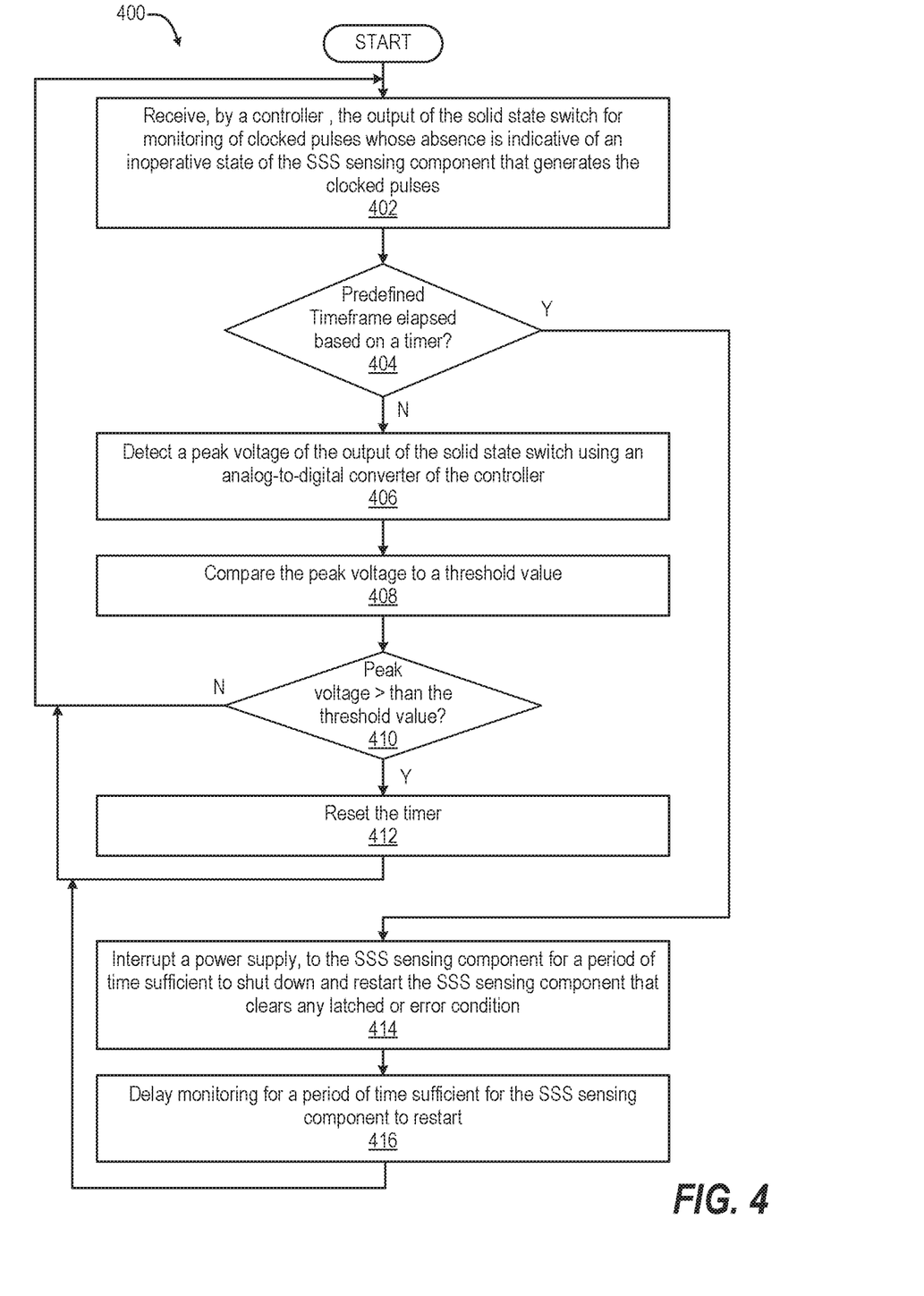
FIG. 4 is a flow diagram of a method for correcting an inoperative state of an SSS sensing component to restore operation of the solid state switch, according to one or more embodiments.

FIG. 4 depicts method 400 for monitoring for and correcting an inoperative state of the SSS sensing component 210 (FIG. 2) to restore operation of the solid state switch 212 (FIG. 2). Method 400 includes receiving, by controller 218 (FIG. 2), the output of the solid state switch for monitoring of clocked pulses, whose absence is indicative of an inoperative state of the SSS sensing component that generates the clocked pulses (block 402). Method 400 includes, in decision block 404, determining, by the controller, whether a predefined timeframe has elapsed based on a timer. In response to determining that the predefined timeframe has not elapsed, method 400 includes detecting a peak voltage of the output of the solid state switch using an analog-to-digital converter of the controller (block 406). The controller compares the peak voltage to a threshold value (block 408). A determination is made in decision block 410 whether the peak voltage is greater than the threshold value. In response to detecting that the peak voltage is greater than the threshold value, method 400 includes resetting the timer (block 412). Then method 400 returns to block 402. In response to detecting that the peak voltage is not greater than the threshold value, method 400 returns to block 402. In response to determining that the predefined timeframe has elapsed, at decision block 404, method 400 includes interrupting a power supply, to the SSS sensing component for a period of time sufficient to shut down and restart the SSS sensing component that clears any latched or error condition (block 414). Method 416 includes delaying monitoring for a period of time sufficient for the SSS sensing component to restart (block 416). Method 400 returns to block 402.

Figure 5:
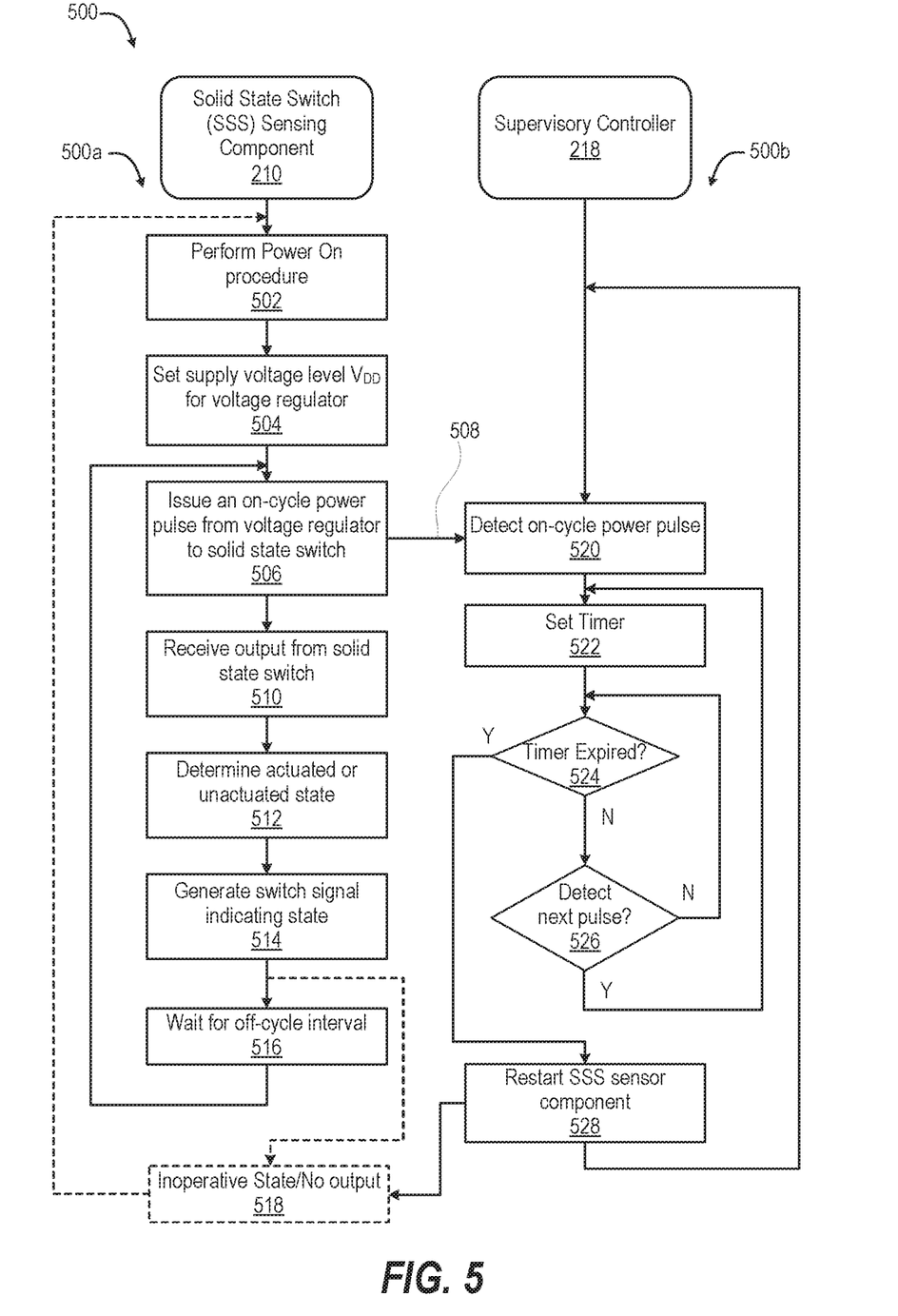
FIG. 5 is a flow diagram of a distributed method for solid state switch sensing with supervisory control to mitigate an inoperative state, according to one or more embodiments.

FIG. 5 is a flow diagram of distributed method 500 that includes method 500a of sensing actuation of a solid state switch by SSS sensing component 210. Method 500 also includes method 500b of mitigating an inoperative state of SSS sensing component 210 by supervisory controller 218. Distributed method 500 enables supervisory controller 218 to determine whether SSS sensing component 210 is inoperative based upon a signal generated by SSS sensing component 210. Supervisory controller 218 avoids having to generate a testing signal to determine whether SSS sensing component 210 is inoperative. Method 500a includes performing a power on procedure by SSS sensing component (block 502). SSS sensing component sets supply voltage level $V_{DD}$ for voltage regulator (block 504). Method 500a includes issuing an on-cycle power pulse from the voltage regulator to the solid state switch (block 506), which at line 508 enables supervisory controller 218 to begin method 500b that is executed in parallel to method 500a.

Method 500b includes receiving an output from the solid state switch (block 510). In one or more embodiments, the on-cycle power pulse causes an electromagnetic signal to pass through a sensor of the solid state switch that is affected by changes in proximity of a conductive target that is moved by actuation. The affect may be capacitive, inductive or resistive. Based on the received output, SSS sensing component determines an actuated or unactuated state of the solid state switch (block 512). Method 500a includes generating a switch signal indicated the state that is determined (block 514). SSS sensing component waits for an off-cycle interval to reduce power consumption by the solid state switch (block 516). Then method 500a under normal operation returns to block 506. However, SSS sensing component can become inoperative, as indicated in a dashed line to an inoperative state with no output (block 518).

With continued reference to method 500b, controller detects the first on-cycle power pulse (block 520). Controller begins active monitoring for an inoperative state once operation of SSS sensing component is enabled by the first power pulse. Method 500b includes setting a timer block 522). The duration can be significantly longer than a duty cycle of the SSS sensing component such that a duration of time elapsed, or expiration of a timer, is associated with an inoperative SSS sensing component. A determination, in decision block 524, is made whether the timer has expired. In response to determining that the timer has not expired, a determination is made in decision block 526 whether the next pulse is detected. In response to determining that the next pulse is not detected, method 500b returns to decision block 524. In response to determining that the next pulse is detected, method 500b returns to block 522. When SSS sensing component is inoperative (block 518), time will continue to elapse until the timer expires. In response to determining that the timer has expired in decision block 524, method 500b includes restarting the SSS sensor component by the controller (block 528). Method 500b returns to block 520 to await being enabled to monitor for another inoperative state when the first pulse from SSS sensing component is detected. SSS sensing component is in a powered down state in response to the restart. Method 500a begins anew at block 502 when power is restored to SSS sensing component.

In each of the above flow charts presented herein, certain steps of the methods can be combined, performed simultaneously or in a different order, or perhaps omitted, without deviating from the spirit and scope of the described innovation. While the method steps are described and illustrated in a particular sequence, use of a specific sequence of steps is not meant to imply any limitations on the innovation. Changes may be made with regards to the sequence of steps without departing from the spirit or scope of the present innovation. Use of a particular sequence is therefore, not to be taken in a limiting sense, and the scope of the present innovation is defined only by the appended claims.

Aspects of the present innovation are described above with reference to flowchart illustrations and/or block diagrams of methods, apparatus (systems) and computer program products according to embodiments of the innovation. It will be understood that each block of the flowchart illustrations and/or block diagrams, and combinations of blocks in the flowchart illustrations and/or block diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

As will be appreciated by one skilled in the art, embodiments of the present innovation may be embodied as a system, device, and/or method. Accordingly, embodiments of the present innovation may take the form of an entirely hardware embodiment or an embodiment combining software and hardware embodiments that may all generally be referred to herein as a "circuit," "module" or "system."

While the innovation has been described with reference to exemplary embodiments, it will be understood by those skilled in the art that various changes may be made, and equivalents may be substituted for elements thereof without departing from the scope of the innovation. In addition, many modifications may be made to adapt a particular system, device or component thereof to the teachings of the innovation without departing from the essential scope thereof. Therefore, it is intended that the innovation not be limited to the particular embodiments disclosed for carrying out this innovation, but that the innovation will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the innovation. As used herein, the singular forms "a", "an" and "the" are intended to include the plural forms as well, unless the context clearly indicates otherwise. It will be further understood that the terms "comprise" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present innovation has been presented for purposes of illustration and description but is not intended to be exhaustive or limited to the innovation in the form disclosed. Many modifications and variations will be apparent to those of ordinary skill in the art without departing from the scope and spirit of the innovation. The embodiments were chosen and described in order to best explain the principles of the innovation and the practical application, and to enable others of ordinary skill in the art to understand the innovation for various embodiments with various modifications as are suited to the particular use contemplated.

What is claimed is:

1. A solid state switch (SSS) monitoring system comprising:
   a solid state switch;
   a SSS sensing component electrically coupled to the solid state switch, and that: (i) periodically generates a clocked pulse that polls the solid state switch; (ii) determines whether an electrical characteristic of an output of the solid state switch indicates that the solid state switch is actuated; and (iii) generates a switch state signal to indicate a corresponding one of an actuated and an unactuated state of the solid state switch; and
a controller communicatively coupled to the SSS sensing component and that restarts the SSS sensing component in response to determining that the SSS sensing component is in an inoperative state due to a fault that prevents polling the solid state switch.

2. The SSS monitoring system of claim 1, wherein the controller:
detects whether the SSS sensing component has polled the solid state switch within a predefined timeframe; and
in response to determining that the SSS sensing component has not polled the solid state switch within the predefined timeframe, determines that the SSS sensing component is in the inoperative state.

3. The SSS monitoring system of claim 1, further comprising a voltage regulator communicatively coupled to the controller, and the controller restarts the SSS sensing component by triggering the voltage regulator to interrupt the power supply to the SSS sensing component.

4. The SSS monitoring system of claim 1, wherein the solid state switch is a selected one of: (i) a capacitive switch; (ii) a resistive switch; (iii) an inductive switch; and (iv) a piezoresistive switch.

5. The SSS monitoring system of claim 1, wherein:
the SSS sensing component comprises:
a clock that generates the clocked pulse; and
a sensor that measures the electrical characteristic of the output of the solid state switch; and
the controller comprises:
an analog-to-digital converter that latches to a peak voltage of the output of the solid state switch to detect the clocked pulse from the SSS sensing component; and
a timer that is reset based on detection of a peak voltage that exceeds a threshold.

6. The SSS monitoring system of claim 1, wherein:
the solid state switch is a power switch; and
the SSS sensing component generates the switch state signal indicating the actuated state that triggers activation of a microprocessor of an electronic device.

7. An electronic device comprising:
a solid state switch (SSS) monitoring system comprising:
a solid state switch;
a SSS sensing component electrically coupled to the solid state switch, and that: (i) periodically generates a clocked pulse that polls the solid state switch; (ii) determines whether an electrical characteristic of an output of the solid state switch indicates that the solid state switch is actuated; and (iii) generates a switch state signal to indicate a corresponding one of an actuated and an unactuated state of the solid state switch; and
a controller communicatively coupled to the SSS sensing component and that restarts the SSS sensing component in response to determining that the SSS sensing component is in an inoperative state due to a fault that prevents polling the solid state switch.

8. The electronic device of claim 7, wherein the controller:
detects whether the SSS sensing component has polled the solid state switch within a predefined timeframe; and
in response to determining that the SSS sensing component has not polled the solid state switch within the predefined timeframe, determines that the SSS sensing component is in the inoperative state.

9. The electronic device of claim 7, further comprising a voltage regulator communicatively coupled to the controller, and the controller restarts the SSS sensing component by triggering the voltage regulator to interrupt a power supply to the SSS sensing component.

10. The electronic device of claim 7, wherein the solid state switch is a selected one of: (i) a capacitive switch; (ii) a resistive switch; (iii) an inductive switch; and (iv) a piezoresistive switch.

11. The electronic device of claim 7, wherein:
the SSS sensing component comprises:
a clock that generates the clocked pulse; and
a sensor that measures the electrical characteristic of the output of the solid state switch; and
the controller comprises:
an analog-to-digital converter that latches to a peak voltage of the output of the solid state switch to detect the clocked pulse from the SSS sensing component; and
a timer that is reset based on detection of a peak voltage that exceeds a threshold.

12. The electronic device of claim 7, further comprising a microprocessor communicatively coupled to the solid state switch and that is activated in response to receiving the switch state signal indicating the actuated state.

13. A method comprising:
periodically polling a solid state switch with a clocked pulse by a solid state switch (SSS) sensing component;
determining, by the SSS sensing component whether an electrical characteristic of an output of the solid state switch indicates that the solid state switch is actuated;
generating, by the SSS sensing component, a switch state signal that indicates a corresponding one of an actuated and an unactuated state of the solid state switch; and
determining, by a controller, whether the SSS sensing component is in an inoperative state; and
restarting the SSS sensing component, by the controller, in response to determining that the SSS sensing component is in an inoperative state due to a fault that prevents polling the solid state switch.

14. The method of claim 13, wherein determining whether the SSS sensing component is in the inoperative state comprises detecting, by the controller, whether the SSS sensing component has polled the solid state switch within a predefined timeframe.

15. The method of claim 14, wherein detecting whether the SSS sensing component has polled the solid state switch within the predefined timeframe comprises:
determining whether the predefined timeframe has elapsed based on a timer;
in response to determining that the predefined timeframe has not elapsed:
detecting a peak voltage of the output of the solid state switch using an analog-to-digital converter of the controller;
comparing the peak voltage to a threshold value; and
in response to detecting that the peak voltage is greater than the threshold value, resetting the timer.

16. The method of claim 15, further comprising:
determining that the SSS sensing component is in the inoperative state in response to determining that the predefined timeframe has elapsed; and
restarting the SSS sensing component, by the controller, by:
interrupting a power supply, to the SSS sensing component to shut down the SSS sensing component.

17. The method of claim 13, wherein the solid state switch is a selected one of: (i) a capacitive switch; (ii) a resistive switch; (iii) an inductive switch; and (iv) a piezoresistive switch.

18. The method of claim 13, further comprising triggering activation of a microprocessor of an electronic device in response to generating the switch state signal indicating the actuated state.

* * * * *